United States Patent
Nattermann et al.

(10) Patent No.: US 9,018,565 B2
(45) Date of Patent: Apr. 28, 2015

(54) GENERATION OF HOLES USING MULTIPLE ELECTRODES

(75) Inventors: Kurt Nattermann, Ockenheim (DE); Ulrich Peuchert, Bodenheim (DE); Wolfgang Moehl, Worms (DE); Stephan Behle, Gau-Odernheim (DE); Dirk Weidmann, Selzen (DE); Sabine Lehnicke, Esseheim (DE)

(73) Assignee: Schott AG, Mainz (DE)

( * ) Notice: Subject to any disclaimer, the term of this patent is extended or adjusted under 35 U.S.C. 154(b) by 84 days.

(21) Appl. No.: 13/807,402

(22) PCT Filed: Jul. 4, 2011

(86) PCT No.: PCT/EP2011/003299
§ 371 (c)(1),
(2), (4) Date: Mar. 8, 2013

(87) PCT Pub. No.: WO2012/000684
PCT Pub. Date: Jan. 5, 2012

(65) Prior Publication Data
US 2013/0206724 A1    Aug. 15, 2013

(30) Foreign Application Priority Data
Jul. 2, 2010    (DE) .......................... 10 2010 025 969

(51) Int. Cl.
*B26F 1/28* (2006.01)
*B44C 1/22* (2006.01)
*B81C 1/00* (2006.01)
*C03C 23/00* (2006.01)

(52) U.S. Cl.
CPC .............. *B44C 1/227* (2013.01); *B81C 1/00087* (2013.01); *B26F 1/28* (2013.01); *C03C 23/00* (2013.01)

(58) Field of Classification Search
None
See application file for complete search history.

(56) References Cited

U.S. PATENT DOCUMENTS 3,483,374 A * 12/1969 Erben ............................ 250/324
3,783,237 A *  1/1974 McArthur ..................... 219/384
4,247,754 A     1/1981 Baier
(Continued)

FOREIGN PATENT DOCUMENTS

CN    101131955 A    2/2008
DE    2830326        1/1980
(Continued)

OTHER PUBLICATIONS

International Search Report dated Oct. 19, 2011 corresponding to International Patent Application No. PCT/EP2011/003299.
(Continued)

*Primary Examiner* — Joseph M Pelham
(74) *Attorney, Agent, or Firm* — Ohlandt, Greeley, Ruggiero & Perle, LLP

(57) ABSTRACT

An apparatus for producing holes in dielectric workpieces in the form of thin sheets and substrates, in particular of glass or glass-like materials and semiconductors is provided. The apparatus includes individual high-voltage electrodes that are symmetrically arranged on an electrode holder around the hole to be produced in the workpiece. The apparatus also includes individual counter electrodes that are arranged on a counter electrode holder. The electrodes and counter electrodes can be connected in a permutating manner to a high-voltage source for the discharge of high-voltage flashovers.

20 Claims, 3 Drawing Sheets

(56) References Cited

U.S. PATENT DOCUMENTS

| | | | |
|---|---|---|---|
| 4,278,871 A | 7/1981 | Schmidt-Kufeke | |
| 4,390,774 A | 6/1983 | Steen et al. | |
| 4,777,338 A | 10/1988 | Cross | |
| 6,348,675 B1 | 2/2002 | Tagaki | |
| 8,136,820 B2 | 3/2012 | Morioka | |
| 2013/0209731 A1* | 8/2013 | Nattermann et al. | 428/131 |
| 2013/0213467 A1* | 8/2013 | Nattermann et al. | 136/256 |
| 2014/0042146 A1* | 2/2014 | Muller-Siebert et al. | 219/384 |

FOREIGN PATENT DOCUMENTS

| | | | |
|---|---|---|---|
| FR | 2475064 A1 * | 8/1981 | |
| JP | H0740150 A | 2/1995 | |
| JP | 5515198 B2 | 11/2008 | |
| WO | WO2005/097439 | 10/2005 | |
| WO | WO2009/059786 | 5/2009 | |
| WO | WO2009/074338 | 6/2009 | |

OTHER PUBLICATIONS

Written Opinion of the International Searching Authority dated Oct. 19, 2011 corresponding to International Patent Application No. PCT/EP2011/003299.

Chinese Office Action dated Jun. 13, 2014 for corresponding Chinese Application No. 201180033225.1 with English translation, 16 pages.

International Preliminary Report on Patentability dated Jan. 8, 2013 corresponding to International Patent Application No. PCT/EP2011/003299.

Japanese Office Action dated Oct. 30, 2014 for corresponding Japanese Application No. 2013-517091 with English translation, 4 pages.

English Translation of International Preliminary Report on Patentability dated Jan. 17, 2013 corresponding to International Patent Application No. PCT/EP2011/003299, 5 pages.

* cited by examiner

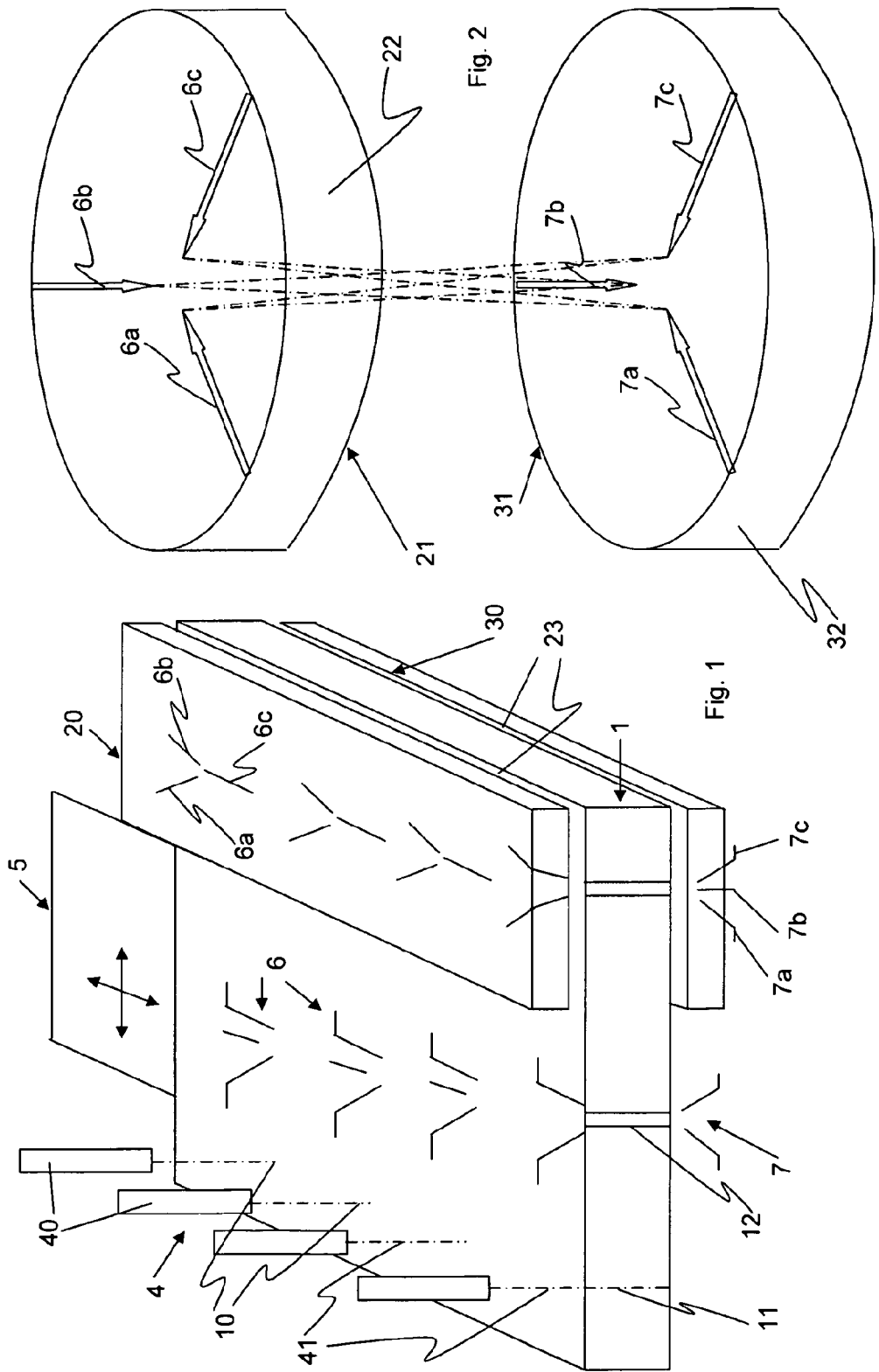

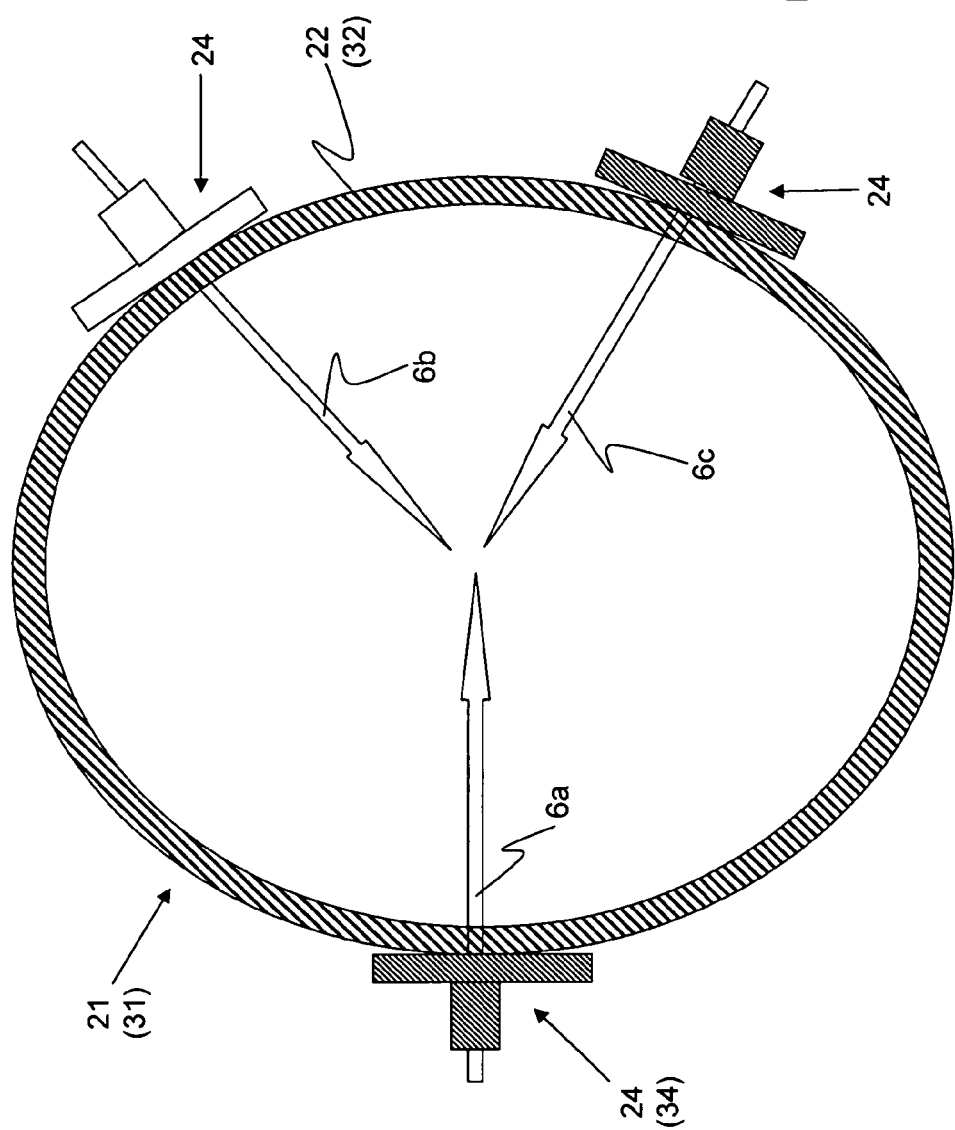

GENERATION OF HOLES USING MULTIPLE ELECTRODES

FIELD OF THE INVENTION

The invention relates to an apparatus and a method for producing holes in dielectric workpieces in form of thin sheets and substrates, in particular of glass or glass-like materials and semiconductors.

BACKGROUND OF THE INVENTION

The perforation of plastic films by electrically generated sparks is known from U.S. Pat. No. 4,777,338. A plurality of electrode-counter electrode pairs is provided, between which the plastic film is guided and across which high-voltage energy is discharged. The film is moved through a water bath, and the temperature of the water bath is utilized to control the size of the perforations.

Another method for producing pores in plastic films is known from U.S. Pat. No. 6,348,675 B1. Pulse sequences are generated between electrode pairs, with the plastic film interposed therebetween, the first pulse serving to heat the plastic film at the perforation point and the further pulses serving to form the perforation and to shape it.

From U.S. Pat. No. 4,390,774, the treatment of non-conductive workpieces by electrical means is known in the sense of cutting the workpiece or welding the workpiece. A laser beam is directed onto the workpiece which is moved during the exposure, and a high voltage is applied to the heated zone using two electrodes to form an arc which serves to process the workpiece. When the workpiece is cut, it burns in a controllable manner. When workpieces are to be welded, streams of reactive or inert gas are additionally directed to the heated zone to react with either the workpiece or the electrode or a fluxing agent. In this way, glass, paper, cloth, cardboard, leather, plastics, ceramics, and semiconductors can be cut, or glass and plastics can be welded, rubber can be vulcanized, and synthetic resins can be cured thermally. However, the equipment is too clunky by its nature as to permit thin holes to be formed in the workpiece.

From WO 2005/097 439 A2 a method is known for forming a structure, preferably a hole or cavity or channel, in a region of an electrically insulating substrate, in which energy, preferably in form of heat, also by a laser beam, is supplied to the substrate or region, and a voltage is applied to the region to produce a dielectric breakdown there. The process is controlled using a feedback mechanism. It is possible to produce thin individual holes one after the other, however it is not possible to employ a plurality of electrode pairs simultaneously. Parallel operating high-voltage electrodes mutually influence each other and do not permit individual control.

From WO 2009/059786 A1 a method is known for forming a structure, in particular a hole or cavity or channel or recess, in a region of an electrically insulating substrate, in which stored electrical energy is discharged across the region and additional energy, preferably heat, is supplied to the substrate or the region to increase electrical conductivity of the substrate or region and thereby initiate a current flow, the energy of which is dissipated in the substrate, i.e. converted into heat, wherein the rate of dissipation of the electrical energy is controlled by a current and power modulating element. An apparatus for simultaneously producing a plurality of holes is not disclosed.

WO 2009/074338 A1 discloses a method for introducing a change of dielectric and/or optical properties in a first region of an electrically insulating or electrically semi-conducting substrate, wherein the substrate whose optical or dielectric properties are irreversibly altered due to a temporary increase in substrate temperature, optionally has an electrically conductive or semi-conductive or insulating layer, wherein electrical energy is supplied to the first region from a voltage supply to significantly heat or melt parts or all of the first region without causing an ejection of material from the first region, and wherein furthermore, optionally, additional energy is supplied to generate localized heat and to define the location of the first region. The dissipation of electrical energy manifests itself in form of a current flow within the substrate.

The dissipation of the electrical energy is controlled by a current and power modulating element. Alterations in substrate surfaces produced by the method also include holes produced in borosilicate glass or silicon substrates which had been provided with an insulating layer of paraffin or a hot melt adhesive. Also, holes are produced in silicon, in zirconia, in sapphire, in indium phosphide, or gallium arsenide. Partially, the discharge process was initiated by laser beam irradiation at a wavelength of 10.6 µm ($CO_2$ laser). Grids of holes are also disclosed, but with relatively large spacings of the holes. An apparatus for simultaneously producing a plurality of holes is not disclosed.

From DE 28 30 326 A1 an arrangement is known for effecting superfine perforation of film-like sheeting using high-voltage pulses. The sheeting is passed, in a substantially contactless manner, between a pair of electrodes to which a high voltage is applied. The two electrodes are composed of multi-row needle arrays. The mutually opposing needles in the needle arrays are connected in pairs to separate excitation circuits, via control lines. The spark discharge between the two needles produces a microscopic perforation hole along the breakdown in the film-like material.

Therefore, it is clear from prior art how to perforate foils and thin sheets of dielectric materials using a high-voltage electric field of appropriate frequency or pulse shape. Local heating of the material reduces the dielectric strength at the points to be perforated, so that the applied field strength is sufficient to cause an electric current to flow across the material. If the material exhibits a sufficiently large increase in electrical conductivity with temperature, as is the case with glasses, glass-ceramics, and semi-conductors (also with many plastics), the result is an "electro-thermal self-focusing" of the perforation channel in the material. The perforation material is getting hotter and hotter, current density increases until the material is evaporated and the perforation is "blown open". However, since the perforation is based on a dielectric breakdown, it is difficult to exactly match the desired location of the breakdown. It is known that e.g. atmospheric flashes follow a very irregular course.

CPU chips have several hundred contact points distributed over a small area on the bottom surface thereof. In order to produce supply lines to the contact points, thin sheets (<1 mm) are used, i.e. fiberglass mats coated with epoxy material referred to as "interposers", through which the supply lines extend. To this end, several hundred holes are placed in the interposer and filled with conductive material. Typical hole sizes range from 250 to 450 µm per hole. There should not be any alterations in length between CPU chip and interposer. Therefore, the interposers should exhibit a thermal expansion behavior similar to that of the semiconductor material of the chip, which, however, is not the case with previously used interposers.

What is also lacking in the prior art is the manufacturing of a multiplicity of thin holes adjacent to one another on an industrial scale, with hole-to-hole spacings ranging from 120 µm to 400 µm, and using the electro-thermal perforation process.

GENERAL DESCRIPTION OF THE INVENTION

An object of the invention is to provide an apparatus for producing holes in dielectric workpieces in form of thin sheets and substrates, in particular of glass or glass-like materials and semiconductors, when requirements have to be met such as those imposed on interposers: It has to be possible for the holes to be positioned exactly (±20 µm). It has to be possible to produce many (from 10 to 10,000) small holes per workpiece with tight hole-to-hole tolerances.

It has to be possible to produce the holes with a narrow hole-to-hole spacing (30 µm to 1000 µm). The hole should have a conical crater-shaped form at the outlet and inlet of the hole, while the central bore portion should be cylindrical. The wall of the hole should be fire-polished. The holes should be producible on an industrial scale, i.e. many microholes per workpiece simultaneously.

The apparatus for producing holes according to the invention is based on individual electrodes and individual counter electrodes symmetrically arranged around the hole to be formed in the workpiece, which are triggered individually to emit high-voltage pulses. Activation of the individual electrodes and counter electrodes is controlled by a random generator or a scheme which ensures that in the statistical average the activated electrode-counter electrode pairs are equally likely for all of the individual electrodes. This provides for axial symmetry of the substantially cylindrical walls of the holes, while the hole edges at the inlet and outlet of the holes are rounded. This hole shape is outstandingly suitable for producing so-called "interposers" which constitute connecting bridges between CPU chips and circuit boards (motherboards).

In detail, an arrangement (array) of electrode holders and counter electrode holders is provided, which confine the processing space for the workpiece. The individual high-voltage electrodes and counter electrodes are mounted to these electrode holders and counter electrode holders. The workpiece to be perforated is positioned by a workpiece holder within the processing space such that the points to be treated are located in the connecting line between the individual high-voltage electrodes and counter electrodes. For providing high-voltage breakdowns across the workpiece, the high-voltage source is connected to individual mutually opposed electrodes-counter electrode pairs. Since for each single hole to be formed there are a plurality of individual electrodes-counter electrode pairs, one single high-voltage electrode is effectively connected to one single counter electrode. In this way, bundles of high-voltage flashovers are produced, which contribute to a desired shape and configuration of a respective created hole.

According to a preferred embodiment of the invention, each of the high-voltage electrodes and the counter electrodes comprise three individual electrodes. This is a good tradeoff between manufacturing complexity of the hole forming apparatus and the quality of hole formation, with the additional advantage that the useful life of the electrodes is extended by more than three times. (The operating breaks between the voltage flashovers cause an interim cooling of the electrodes and thus extension of their life.)

For each of the high-voltage electrodes and counter electrodes, electrode passages are provided through the electrode holders and counter electrode holders. To this end, the electrode shafts have respective ceramic outer sleeves for insulation purposes, and ring structures are provided for precisely supporting the respective electrode jackets.

A preferred material of the electrodes is tungsten carbide alloy. The electrodes are equipped with precisely formed electrode tips (µm range) which may be produced by spark machining (Electric Discharge Machining—EMD).

To produce a plurality of holes simultaneously, a multiple array of electrode-counter electrode pairs is arranged symmetrically around perforations to be formed. Each of these electrode-counter electrode pairs is supplied by a separate high-voltage source. In this way it is avoided that a hole which has become conductive attracts the current from all the holes that have not become conductive yet. The independency of power supply for each electrode-counter electrode pair provides for independent generation of each individual hole in the workpiece.

In order to precisely position the holes, the perforation points may be marked by preparing the workpiece at the desired location for the high-voltage flashover. For this purpose, laser beams of a sufficiently high intensity may be used, which damage the material of the workpiece along respective filamentary channels thereby reducing the electrical breakdown strength at these locations. The high-precision preparation of the marks ensures high-precision positioning of the holes in the subsequent electro-thermal perforation process.

The marking of the perforation points may also be accomplished by coupling material printed to the workpiece in form of dots (having a large dielectric loss tangent), which material includes components that promote the dielectric breakdown.

BRIEF DESCRIPTION OF THE DRAWINGS

Exemplary embodiments of the invention will now be described with reference to the drawings, wherein:

FIG. 1 is a schematic view of an apparatus for producing holes in dielectric workpieces;

FIG. 2 is a schematic diagram of a high-voltage electrode and counter electrode; and FIG. 3 shows a high-voltage electrode.

DETAILED DESCRIPTION

Figure 4:
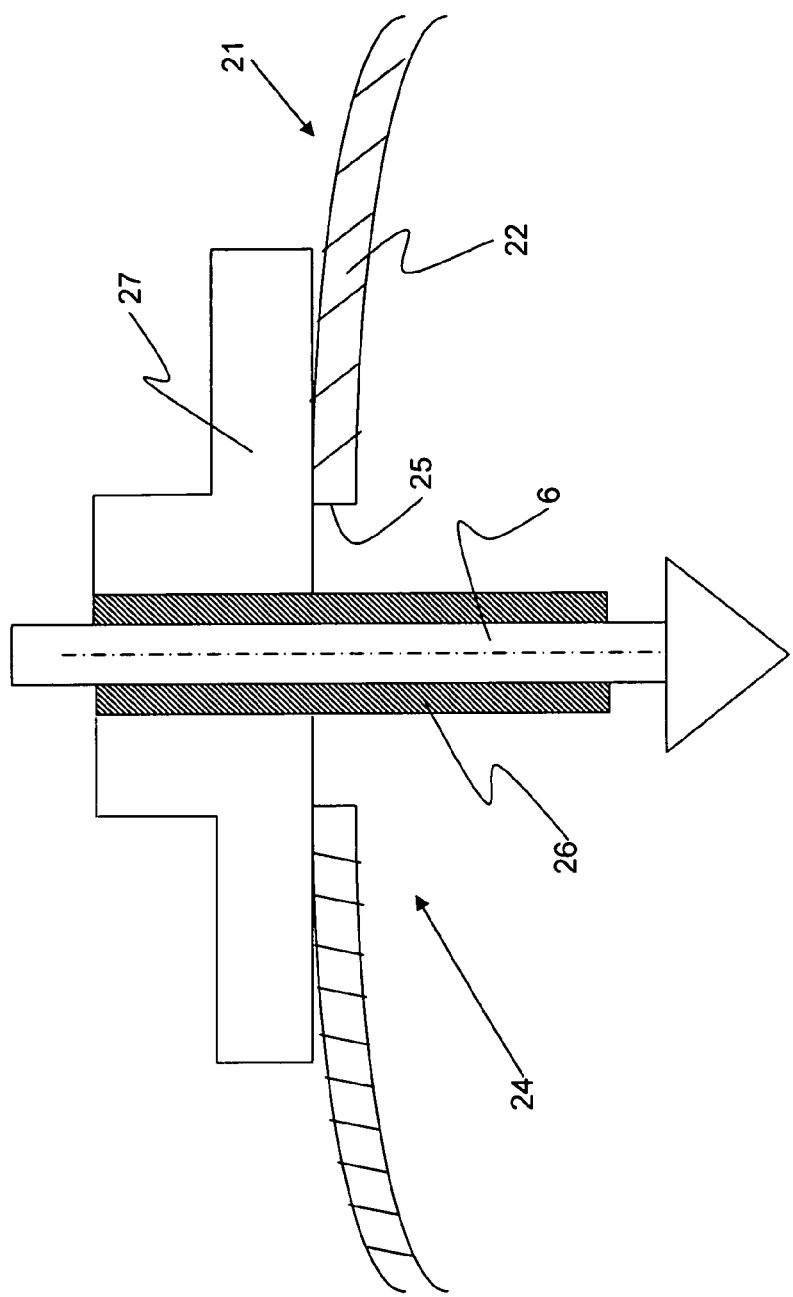
FIG. 4 an enlarged detail of FIG. 3.

FIG. 1 illustrates an apparatus for marking perforation points 10 and producing holes 12 in dielectric workpieces 1. The marking means comprises an array 4 of lasers 40, which is not essential for the purposes of the invention but allows very precise positioning of the predetermined perforations. Lasers 40 emit light beams 41 in a wavelength range for which the dielectric workpiece 1 is substantially transparent, however with such a high intensity that the light beams 41 cause a filamentary channel 11 of damages in the material of workpiece 1, at precisely those points where the perforation is desired. "Substantially transparent" herein means that the laser beam may penetrate deep enough into the material to be perforated, the material however exhibiting sufficient absorption so that the damage occurs along channel 11.

The holes 12 of desired dimensions are produced by cooperating electrodes 6 and counter electrodes 7. The mutually opposing and cooperating electrodes 6 and 7 are arranged symmetrically around a respective hole 12 to be formed and are configured as multiple individual electrodes. In the present embodiment, three individual electrodes 6a, 6b, 6c are generally fixed in a support structure 20 as schematically illustrated, and individual electrodes 7a, 7b, 7c are fixed in another support structure 30. Processing space 23 for workpiece 1 extends between supporting structures 20, 30. Within processing space 23, workpiece 1 may be displaced and precisely positioned using a workpiece holder 5.

Supporting structures 20, 30 are adapted for supporting a plurality of electrode holders 21 and 31, respectively (FIG. 2), which form a respective array in their support structure 20 or 30, respectively. Each electrode holder, 21 and 31, respectively, comprises a cylinder jacket, 22 and 32, respectively, and three passages, 24 and 34, respectively, for three individual electrodes which are disposed with their tips at a point near the axis of the cylinder jacket (see FIG. 3).

Electrodes 6, 7 are connectable to a high-voltage source (not shown) to generate sparks between electrodes 6 and counter electrodes 7, as shown in detail in FIG. 2. Individual electrodes 6a, 6b, 6c, and 7a, 7b, 7c, are connected to a permutation device, not shown, which for example connects electrodes 6a, 6b, 6c to the high-voltage source in a rotating order, while individual counter electrodes 7a, 7b, 7c are connected to the opposite pole of the high-voltage source in a random order. It is also possible to apply a different triggering scheme to ensure that all effective electrode pairs occur equally likely. So from each electrode tip a spark emanates towards each other counter electrode, so that it can be expected that the walls of holes 12 extend cylindrically, at least in their central portion, and keep axial symmetry. Furthermore, it can be expected that the hole edges at the inlet and outlet of the holes are rounded-broken, as it is desired.

FIG. 4 shows a passage 24 for an individual electrode 6 across cylinder jacket 22 of electrode holder 21. Passage 34 across electrode holder 31 is similar. Cylinder jacket 22 has recesses 25 through which the respective individual electrodes extend. The shafts of these electrodes are covered by an electrically insulating ceramic sleeve 26 which may consist of high-temperature resistant aluminum oxide and which is embedded in a plate 27 of temperature resistant material. Plate 27 is attached to cylinder jacket 22 above recess 25. The individual electrodes have perfect electrode tips made of tungsten carbide alloy and sharpened using an EDM process (Electric Discharge Machining), so that the tips are sharp in the micron range.

Instead of the laser array 4 comprising marking means, a marking means may be used which imprints coupling points according to the pattern of perforations 10. The coupling material promotes the electrical breakdown and the melt flow in the perforated region of the workpiece.

The apparatus of FIG. 1 is operated as follows:

If particularly precise positioning of the perforation points 10 is of concern, such perforation points are marked, which in the case of FIG. 1 is accomplished by the array 4 of lasers 40 emitting laser radiation 41. Workpiece 1, which for example is made of glass, is penetrated by the radiation 41 at the perforation points 10, and the radiation 41 is so intense that a filamentary channel 11 of damage is formed in the glass. However, this pre-treatment is not essential for the basic operation of the apparatus of FIG. 1.

Workpiece 1 is positioned relative to electrodes-counter electrodes 6, 7 such that the intended perforation points 10 come to lie in the respective connecting lines between these electrode-counter electrode pairs 6, 7. By applying a high voltage, breakdowns are caused at the perforation points across the material of the workpiece 1; a specialty of the invention being that discharge sparks are generated symmetrically around each perforation point running from individual electrodes 6a, 6b, 6c to individual electrodes 7a, 7b, 7c. The permutation device, not illustrated, ensures that in each case one individual electrode of electrode holder 21 cooperates with one individual electrode of electrode holder 31, which means that a spark jumps across these individual electrodes, as illustrated in FIG. 2. The permutation device provides for alternate switching of the individual electrodes such that on average all of the individual electrodes of each electrode holder cooperate with the individual electrodes of the corresponding counter electrode holder and will be stressed equally likely, on average. In this way axial symmetry of the hole walls is obtained, the holes being cylindrical in their central portion while the edges at the periphery of the holes are rounded off. This hole contour is particularly suitable for use of the workpiece as an interposer.

Instead of widening the breakdowns using high-voltage discharges, a process step of deep reactive ion etching may be performed.

The invention claimed is:

1. An apparatus for producing holes in a thin sheet dielectric workpiece, comprising:
   an electrode holder and a counter electrode holder defining a processing space sufficient to receive the workpiece;
   a plurality of electrodes and a plurality of counter electrodes arranged opposed to each other on either side of the workpiece and supported by the electrode and counter electrode holders, each of the plurality of electrodes having a plurality of individual high-voltage electrodes, and each of the plurality of counter electrodes having a plurality of individual high-voltage counter electrodes, the plurality of individual electrodes and individual counter electrodes being arranged symmetrically around each hole to be produced in the workpiece; and
   a workpiece holder configured to displace the workpiece relative to the electrode and counter electrode holders so as to position the workpiece in the processing space with a perforation point between a respective one of the plurality of individual electrodes and counter electrodes,
   wherein the plurality of individual electrodes and counter electrodes are alternately connectable to a high-voltage source to provide high-voltage breakdowns.

2. The apparatus as claimed in claim 1, wherein the plurality of individual electrodes and counter electrodes are connectable in pairs.

3. The apparatus as claimed in claim 2, wherein the connection in pairs of the plurality of individual electrodes and counter electrodes is variable by a permutation circuit.

4. The apparatus as claimed in claim 2, wherein each electrode-counter electrode pair is connectable to a separate high-voltage source.

5. The apparatus as claimed in claim 1, wherein the plurality of individual high-voltage electrodes and counter electrodes comprises three individual high-voltage electrodes and three individual high-voltage counter electrodes.

6. The apparatus as claimed in claim 1, wherein the electrode holder and counter electrode holder each comprise a cylinder jacket and electrode passages for the plurality of individual electrodes and counter electrodes.

7. The apparatus as claimed in claim 6, wherein the plurality of electrodes and counter electrodes have electrode shafts that are insulated by a respective ceramic outer sleeve.

8. The apparatus as claimed in claim 1, wherein the plurality of electrodes and counter electrodes are made of a tungsten carbide alloy.

9. The apparatus as claimed in claim 1, wherein the plurality of electrodes and counter electrodes have precisely formed electrode tips.

10. The apparatus as claimed in claim 1, further comprising a marking device configured to mark perforation points on the workpiece.

11. The apparatus as claimed in claim 10, wherein the marking device comprises a multiple array of lasers arranged in accordance with the pattern of the holes to be produced.

12. The apparatus as claimed in claim 10, wherein the marking device comprises a multiple array of lasers movable in accordance with the pattern of the holes to be produced.

13. The apparatus as claimed in claim 10, wherein the marking device comprises a multiple array of lasers that can emit radiation in a wavelength range for which the workpiece is substantially transparent, and with a radiation intensity being such that the workpiece experiences non-thermal damages along filamentary channels that mark the perforation points as regions of reduced dielectric strength to high-voltage sparks.

14. The apparatus as claimed in claim 10, wherein the marking device is configured to apply a dot-shaped coupling material to the workpiece, and wherein the coupling material has a high dielectric loss tangent and includes substances that promote high-voltage breakdown and melt flow.

15. A method for producing holes in a thin sheet dielectric workpiece, comprising the steps of:

introducing the workpiece into a processing space between electrodes and counter electrodes having a symmetric arrangement of individual electrodes and counter electrodes around a respective hole to be produced in the workpiece;

alternately subjecting the individual electrodes and counter electrodes of each respective hole to be produced to a high-voltage to produce electrical breakdowns across the workpiece; and widening the breakdowns to the desired size of the holes.

16. The method as claimed in claim 15, wherein the alternately subjecting step comprises implementing a triggering scheme in which all effective electrode pairs are subjected to the high-voltage equally often.

17. The method as claimed in claim 15, further comprising marking the work piece at an intended perforation points before the introducing step.

18. The method as claimed in claim 16, wherein the marking step comprises producing filamentary channels in the workpiece using laser radiation.

19. The method as claimed in claim 18, wherein the marking step comprises applying a coupling material in dot form, the coupling material have a high dielectric loss tangent and promoting high-voltage breakdown and melt flow.

20. The method as claimed in claim 15, wherein the widening step comprises deep reactive ion etching.

* * * * *